United States Patent
Tsai et al.

(10) Patent No.: US 6,552,921 B2
(45) Date of Patent: Apr. 22, 2003

(54) CIRCUIT TO SIMULATE THE POLARIZATION RELAXATION PHENOMENON OF THE FERROELECTRIC MEMORY

(75) Inventors: Ching-Wei Tsai, Hsinchu (TW); Shyue-Yi Lee, Hsinchu (TW); Ta-Hui Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/050,075

(22) Filed: Jan. 15, 2002

(65) Prior Publication Data

US 2003/0058682 A1 Mar. 27, 2003

(30) Foreign Application Priority Data

Sep. 25, 2001 (TW) .......................................... 90123541 A

(51) Int. Cl.[7] .............................................. G11C 11/22
(52) U.S. Cl. ................... 365/145; 365/149; 365/189.09
(58) Field of Search ................................ 365/145, 149, 365/189.09, 189.11, 207, 148, 175

(56) References Cited

U.S. PATENT DOCUMENTS 5,905,671 A * 5/1999 DeVilbiss .................... 365/145

* cited by examiner

Primary Examiner—David Lam
(74) Attorney, Agent, or Firm—J.C. Patents

(57) ABSTRACT

A circuit to simulate the polarization relaxation phenomenon of the ferroelectric memory. The circuit has a MOS transistor, a ferroelectric capacitor, a capacitor, and a relaxation voltage source. The gate of the MOS transistor is coupled to a word line and the source of the MOS transistor is coupled to a bit line. A first electrode of the ferroelectric capacitor is coupled to the drain of the MOS transistor and the second electrode of the ferroelectric capacitor is coupled to a plate line. A first electrode of the capacitor is coupled to the drain of the MOS transistor. A first electrode of the relaxation voltage source is coupled to the second electrode of the capacitor, and the second electrode of the relaxation voltage source is coupled to a ground. The capacitance of the capacitor mentioned above is selectively far smaller than the capacitance of the bit line.

12 Claims, 5 Drawing Sheets

CIRCUIT TO SIMULATE THE POLARIZATION RELAXATION PHENOMENON OF THE FERROELECTRIC MEMORY

CROSS-REFERENCE TO RELATED APPLICATION

This application claims the priority benefit of Taiwan application Ser. No. 90123541, filed Sep. 25, 2001.

BACKGROUND OF THE INVENTION

1. Field of Invention

The present invention generally relates to a circuit to simulate the characteristic of the memory. In particular, the present invention pertains to a circuit to simulate the characteristic of the ferroelectric memory (FeRAM), and more particularly, to a circuit to simulate the polarization relaxation phenomenon of the ferroelectric memory.

2. Description of Related Art

The memory cell of the ferroelectric memory has the same structures as the memory cell of the general dynamical random access memory (DRAM). That is, both of the memory cells comprise a MOS transistor and a capacitor, and use the word line and the bit line to control the operation of the memory cell. The difference between the memory cell of the ferroelectric memory and DRAM is one of the electrodes of the capacitor in FeRAM memory cell needs to be coupled to a drive line, but the drive line does not exist in the memory cell of DRAM. By applying appropriate bias to the word line, the bit line and the drive line of the FeRAM memory cell, the operations of the read and write can be implemented in the FeRAM memory cell.

FIG. 1 shows the hysteresis loop diagram of the ferroelectric memory. The polarization magnitude starts to increase when a voltage is applied to the ferroelectric material. After the applied voltage approaches a constant magnitude (e.g. about 5 V), the polarization magnitude starts to descend. However, when the applied voltage goes down to 0 V, the polarization magnitude goes down to $P_{r+}$ rather than 0. In practice, the polarization magnitude goes down to $P_{re1+}$ rather than $P_{r+}$ when the applied voltage going down to 0 V where $P_{re1+}$ is a little smaller than $P_{r+}$. Thus, there exists a difference value of $P_{re1+}-P_{r+}$. The polarization magnitude starts to increase when the voltage (negative voltage) is continuously applied and approaches a constant magnitude (e.g. about −5 V). However, when the applied voltage goes up to 0 V, the polarization magnitude goes up to $P_{r-}$ rather than 0. In practice, the polarization magnitude goes up to $P_{re1-}$ rather than $P_{r-}$ when the applied voltage goes up to 0 V where $P_{re1-}$ is a little smaller than $P_{r-}$. Thus, there exists a difference value of $P_{r-}-P_{re1-}$. This results from the polarization relaxation phenomenon.

The polarization relaxation phenomenon results in the non-continuous characteristic of the hysteresis loop while the applied voltage is 0 V. Thus, there exists a gap ($P_{re1+}-P_{r+}$ or $P_{r-}-P_{re1-}$) However, the current simulation circuits of the ferroelectric memory are all built based on the ideal hysteresis loop, which does not consider the polarization relaxation phenomenon.

FIG. 2 is a circuit diagram of the conventional ferroelectric memory simulation circuit. The circuit comprises a MOS transistor 10 and a ferroelectric capacitor 12; the structure of this circuit is the same as that of a conventional DRAM except for the ferroelectric capacitor 12 and the plate line PL. The gate of the MOS transistor 10 is coupled to a word line WL, the source of the MOS transistor 10 is coupled to a bit line BL, and the drain of the MOS transistor 10 is coupled to a first electrode of the ferroelectric capacitor 12. The second electrode of the ferroelectric capacitor 12 is coupled to a plate line PL. When the circuit is operating, the operation of writing a "0" into the memory cell is accomplished by connecting the plate line PL to ground and applying power $V_{DD}$ to the bit line BL. Contrariwise, the operation of writing a "1" into the memory cell is accomplished by connecting the bit line BL to ground and applying power $V_{DD}$ to the plate line PL. Therefore, the write operation of the ferroelectric memory can be implemented. The operation of reading from the ferroelectric memory is accomplished by floating the bit line BL and applying power $V_{DD}$ to the plate line PL.

When considering the original characteristic of the hysteresis loop of the ferroelectric material, the conventional simulation circuit of the ferroelectric memory cannot describe the hysteresis loop correctly. FIG. 3 is a comparison diagram of the hysteresis loop, which compares the hysteresis loop of the actual measurement of the ferroelectric memory and the hysteresis loop using the conventional simulation circuit to simulate the hysteresis loop of the ferroelectric memory. In FIG. 3, the vertical ordinate is the polarization magnitude ($\mu C/cm^2$), and the horizontal ordinate is the voltage (V). When the polarization magnitude of the ferroelectric material is measured while the applied voltage is 0 V, the polarization magnitude increases and decreases abruptly. That means a gap exists, leading to a non-continuous phenomenon. From the circle portion that marked as 20 in the diagram, the hysteresis loop I that is simulated from the conventional simulation circuit is a continuous variance. That is, the conventional simulation circuit only presents the ideal characteristic of the hysteresis loop, but cannot accurately express the true characteristic of the ferroelectric material.

When the circuit model mentioned above is deployed in the simulation of the ferroelectric memory, it causes an exaggerative phenomenon in the sense voltage such that the sense voltage characteristic of the ferroelectric memory cannot be reflected accurately. One of the most important effects of the ferroelectric memory is the fast-decaying that results from the polarization relaxation phenomenon. The fast-decaying deteriorates the sense margin between the switching level and non-switching level.

As mentioned above, the lack of the capability to simulate the polarization relaxation phenomenon from the conventional simulation circuit affects severely the design and research of the ferroelectric memory. Consequently, the physical characteristics of the ferroelectric memory cannot be simulated efficiently.

SUMMARY OF THE INVENTION

Therefore, the objective of the present invention is to provide a circuit to simulate the polarization relaxation phenomenon of the ferroelectric memory. The circuit simulates the non-continuous characteristic of the hysteresis loop of the ferroelectric material and expresses the polarization relaxation phenomenon accurately.

It is therefore another objective of the present invention is to provide a circuit to simulate the polarization relaxation phenomenon of the ferroelectric memory. The circuit simulates the non-continuous characteristic of the hysteresis loop of the ferroelectric material. The circuit simulates the physical characteristics of the ferroelectric memory accurately while conducting the design and research of the ferroelectric memory.

To achieve the above and other objectives, the present invention provides a circuit to simulate the polarization relaxation phenomenon of the ferroelectric memory. The circuit comprises a MOS transistor, a ferroelectric capacitor, a capacitor, and a relaxation voltage source. The gate of the MOS transistor is coupled to the word line and the source of the MOS transistor is coupled to the bit line. A first electrode of the ferroelectric capacitor is coupled to the drain of the MOS transistor and the second electrode of the ferroelectric capacitor is coupled to a plate line. A first electrode of the capacitor is coupled to the drain of the MOS transistor. The first terminal of the relaxation voltage source is coupled to the second electrode of the capacitor, and the second terminal of the relaxation voltage source is coupled to a ground. The capacitance of the capacitor mentioned above is selectively far smaller than the capacitance of the bit line. The output voltage of the relaxation voltage source is logarithmic time dependence.

The present invention further provides a circuit to simulate the polarization relaxation phenomenon of the ferroelectric memory. The circuit comprises a MOS transistor, a ferroelectric capacitor, a capacitor, and a relaxation voltage source. A first electrode of the ferroelectric capacitor is coupled to the drain of the MOS transistor and the second electrode of the ferroelectric capacitor receives the control voltage to supply power to the ferroelectric capacitor. A first electrode of the capacitor is coupled to the drain of the MOS transistor. The relaxation voltage source is coupled to the capacitor. The output voltage of the relaxation voltage source is a logarithmic time dependence.

The present invention thus provides a relaxation voltage source being coupled to the simulation circuit of the ferroelectric memory cell, wherein the output voltage of the relaxation voltage source is a logarithmic time dependence. The circuit can simulate the non-continuous characteristic of the hysteresis loop of the ferroelectric material precisely. Further, the circuit according to the present invention also expresses the physical characteristics of the ferroelectric memory more precisely while conducting the predict and design of the ferroelectric memory.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION OF THE PREFERRED EMBODIMENTS

The present invention adds a circuit capable of simulating the relaxation phenomenon of the ferroelectric material into the simulation circuit of the ferroelectric memory. By using the relaxation voltage source according to the present invention to simulate the behavior of the ferroelectric memory, the actual physics behavior of the ferroelectric memory can be fully expressed. Furthermore, the behavior of the ferroelectric memory can be predicted more precisely when the simulation is proceeding.

Figure 4:
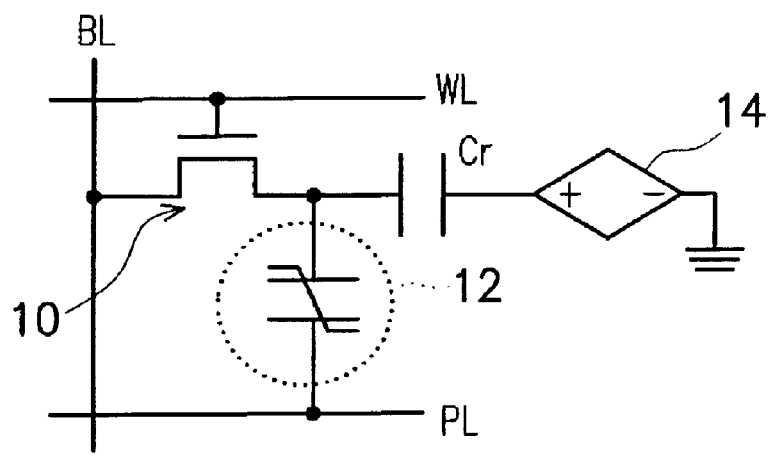
FIG. 4 is a circuit diagram to simulate the ferroelectric memory according to the present invention.

FIG. 4 is a circuit diagram to simulate the ferroelectric memory. The circuit of the ferroelectric memory cell comprises a MOS transistor 10, a ferroelectric capacitor 12, a lineal capacitor Cr, and a relaxation voltage source 14. The gate of the MOS transistor 10 is coupled to a word line WL, the source of the MOS transistor 10 is coupled to a bit line BL, and the drain of the MOS transistor 10 is coupled to a first electrode of the ferroelectric capacitor 12. The second electrode of the ferroelectric capacitor 12 is coupled to a plate line PL. A first electrode of the linear capacitor Cr is coupled to the drain of the MOS transistor 10 and the second electrode of the linear capacitor Cr is coupled to a first terminal of the relaxation voltage source 14. The second terminal of the relaxation voltage source 14 is coupled to a ground. The capacitance of the linear capacitor Cr mentioned above is selectively far smaller than the capacitance of the bit line. The output voltage of the relaxation voltage source 14 is a logarithmic time dependence. The present invention uses the relaxation voltage source 14 to precisely simulate the operation characteristic of the ferroelectric memory cell.

Figure 5:
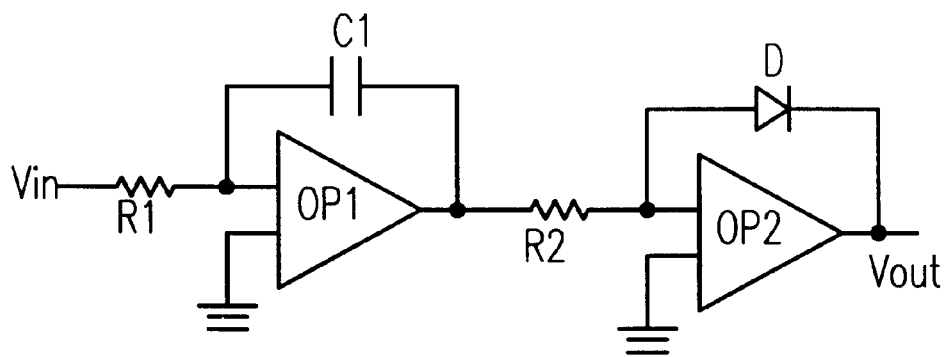
FIG. 5 is a circuit diagram of an example of the relaxation voltage source in FIG. 4.

FIG. 5 is a circuit diagram of an example of the relaxation voltage source in FIG. 4. It is worth noting that the circuit diagram shown in FIG. 5 is only an example; any output voltage having logarithmic time dependence can be used as the relaxation voltage source according to the present invention.

As shown in FIG. 5, the relaxation voltage source 14 comprises a first resistor R1, a first operational amplifier OP1, a capacitor C1, a second resistor R2, a second operational amplifier OP2, and a diode. A first end of the first resistor R1 is coupled to one of the inputs of the first operational amplifier OP1 and the second end of the first resistor R1 is coupled to the input voltage Vin. The capacitor C1 is coupled between the output of the first operational amplifier OP1 and the input of the first operational amplifier OP1. The second resistor R2 is coupled between the output of the first operational amplifier OP1 and one of the inputs of the second operational amplifier OP2. The diode D is coupled between the output of the second operational amplifier OP2 and the input of the second operational amplifier OP2.

According to the circuit theory, one of the ordinary skill in the art can easily calculate the output voltage Vout of the relaxation voltage source 14 satisfy the following equation:

$$V_{out} \approx V_0 \ln\left(\frac{|V_{in}|t}{I_0 C_1 R_1 R_2}\right) \propto \ln t$$

Where $V_0$ and $I_0$ are characteristic parameters of the diode D. Generally speaking, according to the circuit characteristic of the diode, the current flows through the diode D can be obtained from the following equation:

$$I = I_0\left(\exp\frac{V}{V_0} - 1\right)$$

It is obvious from the above equation that the output voltage Vout of the relaxation voltage source 14 is directly proportional to the logarithm of the time. That is the output voltage is logarithmic time dependence.

The relaxation voltage source 14 mentioned above outputs the pull-up/down voltage signals having the logarithmic time dependence characteristic to simulate the variations of the polarization characteristic of the ferroelectric material.

The following part uses a plurality of the physical characteristics to compare the results of the actual measurement and the results using the simulation circuit according to the present invention. The following illustrates that the simulation circuit according to the present invention can precisely simulate the behavior characteristic of the actual ferroelectric memory.

Figure 6:
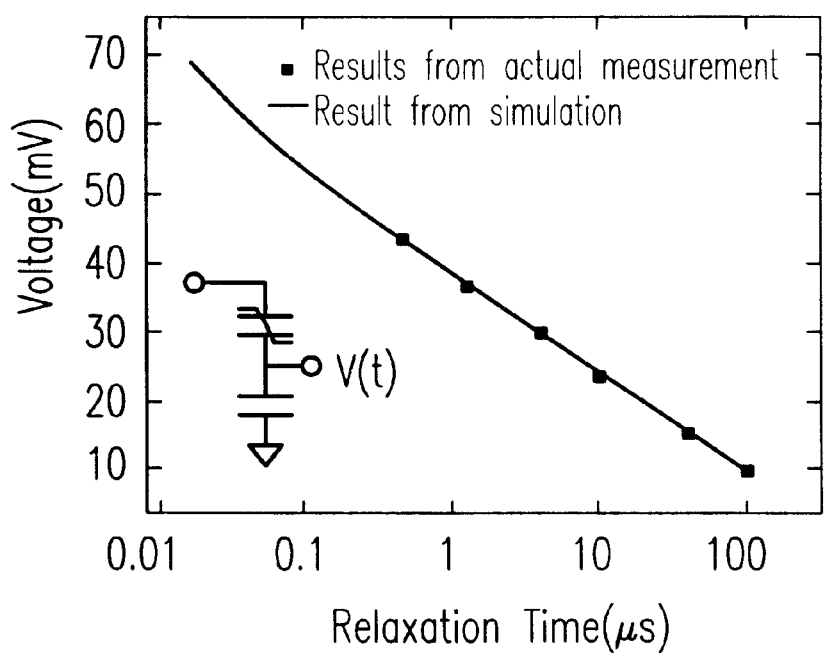
FIG. 6 is a relationship diagram of the relaxation time and the voltage; the diagram shows the decay ratio of the relaxed component.

FIG. 6 shows the relationship between the relaxation time and the voltage. It also shows the decay ratio of the relaxed component. As shown in FIG. 6, the square marks represent the results from the actual measurement; the solid line represents the results from the measurement using the circuit in FIG. 4.

FIG. 6 also shows the pulse response after connecting a capacitance load to the ferroelectric capacitor. The vertical ordinate is voltage V(t), and the horizontal ordinate is relaxation time ($\mu s$). In the real ferroelectric memory cell, the voltage of the relaxed component descends along with the time increase. That means the voltage of the relaxed component decays fast. As shown in FIG. 6, the results (square mark) of the actual measure express this characteristic. The simulation results from the circuit model according to the present invention are in accord with the results from the actual measurement and the fast-decaying phenomenon is also shown in this diagram. Therefore, the simulation circuit of the ferroelectric memory according to the present invention predicts the behavior characteristic of the ferroelectric memory cell precisely.

Figure 1:
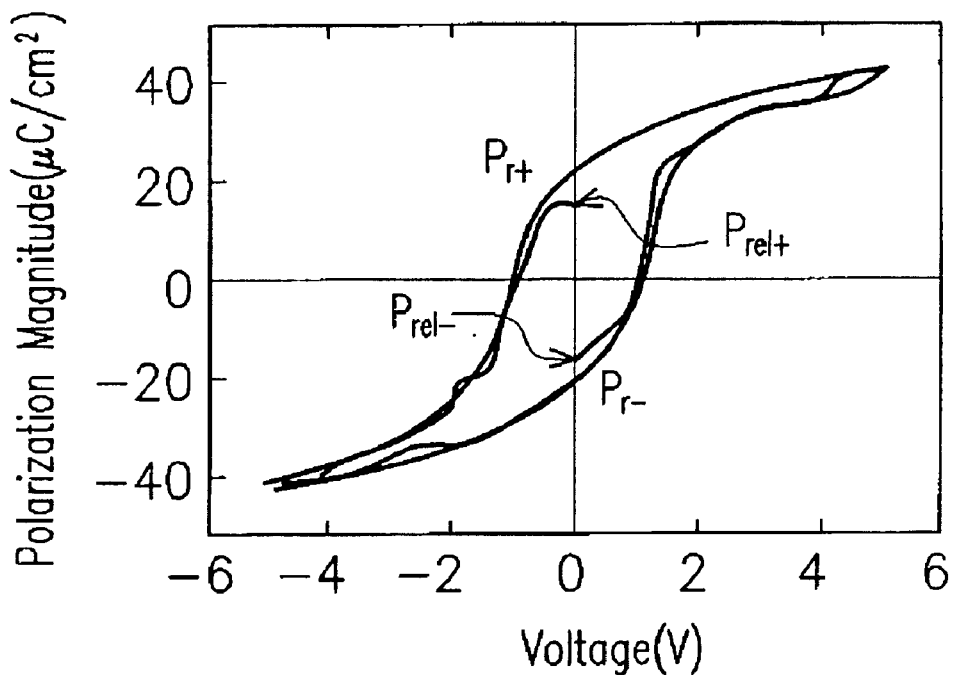
FIG. 1 is a hysteresis loop diagram of the conventional ferroelectric memory.
Figure 2:
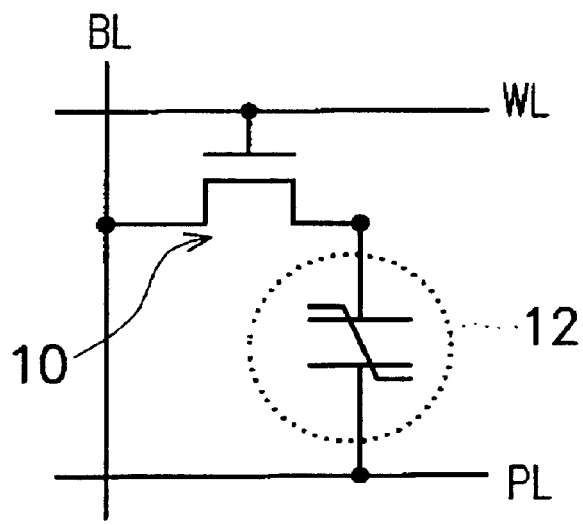
FIG. 2 is a circuit diagram of the conventional simulation circuit that simulates the ferroelectric memory.
Figure 3:
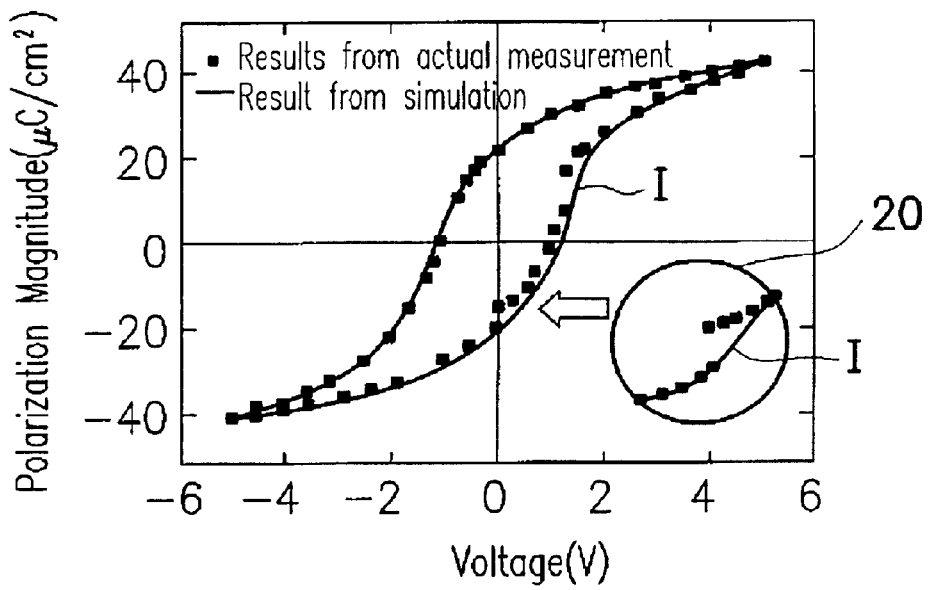
FIG. 3 is a comparison diagram of the hysteresis loop; it shows both the hysteresis loop of the actual measurement of the ferroelectric memory and the hysteresis loop of the simulation result of the ferroelectric memory by using the conventional simulation circuit.
Figure 7:
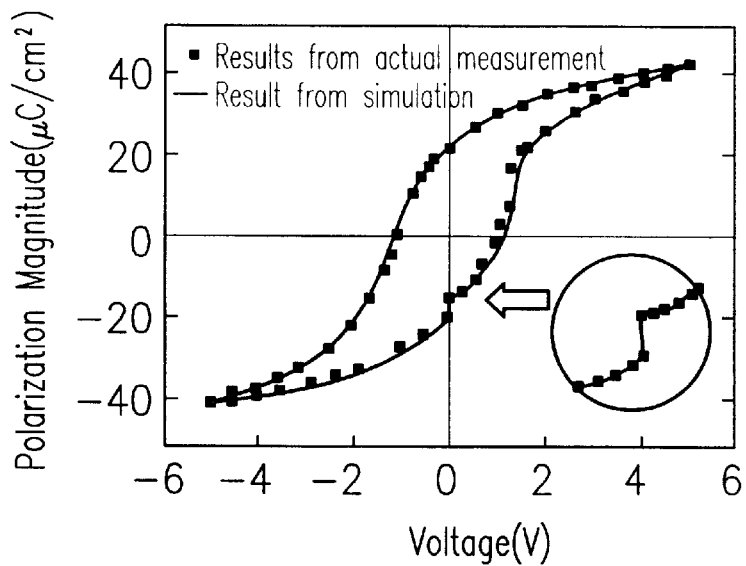
FIG. 7 is a comparison diagram of the hysteresis loop; it shows both the result of the actual measurement of the ferroelectric memory and the simulation result of the ferroelectric memory by using the simulation circuit according to the present invention.

FIG. 7 is a hysteresis loop diagram of the ferroelectric memory to compare the results of the simulation and the actual measurement. In FIG. 7, the vertical ordinate is the polarization magnitude ($\mu C/cm^2$), and the horizontal ordinate is voltage (V). The square marks represent the result of the actual measurement. The solid line represents the result of the measurement using the circuit in FIG. 4. The magnified circle portion is of particular interest. As mentioned above, the hysteresis loop of the ferroelectric material equips the non-continuous characteristic, which means the polarization magnitude is increasing or decreasing abruptly while the voltage is 0 V such that a gap is generated. From FIG. 7, it is obvious that the relaxation voltage source 14 of the simulation circuit according to the present invention simulates the non-continuous (gap) characteristic of the hysteresis loop precisely. Therefore, when compared to the conventional simulation circuit, the conventional simulation circuit in FIG. 2 only simulates the continuous hysteresis loop and lacks the capability to simulate the gap characteristic of the hysteresis loop. From this result, it can be understood that the present invention predicts and simulates the ferroelectric material very precisely.

Figure 8:
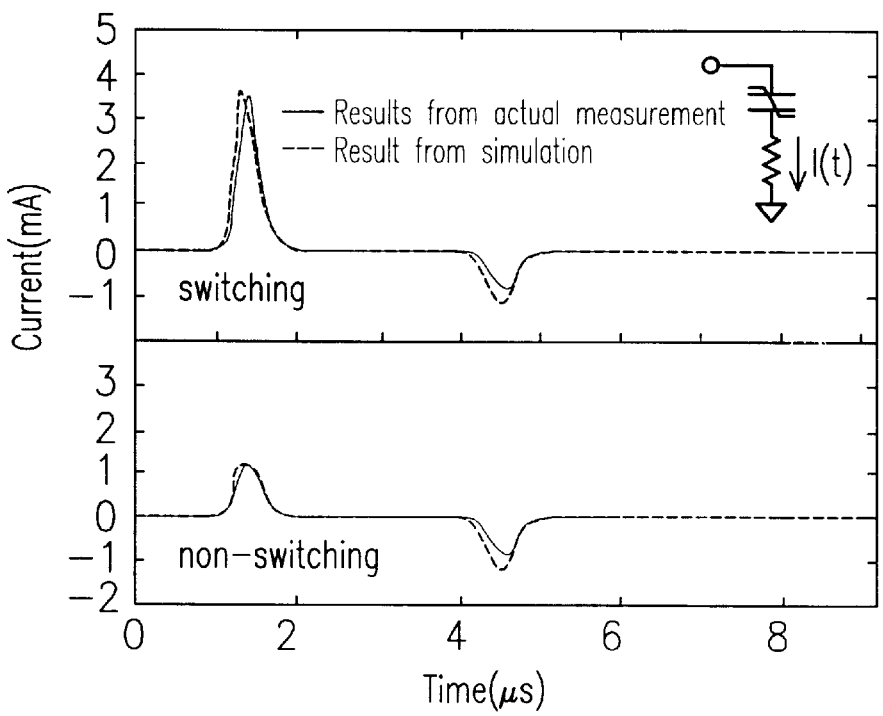
FIG. 8 is a relationship diagram of the current of the resistance load and time. It shows the physical measurement and the simulation result of the switching level (upper half) and the non-switching level (lower half)

FIG. 8 shows the relationship between the current and the time, wherein the ferroelectric capacitor is coupled to a resistance load. The variance relationship between the time and the current flows through the resistance load is measured. FIG. 8 shows the actual measurement and the simulation result of switching level (the upper half of FIG. 8) and non-switching level (the lower half of FIG. 8) respectively. The solid line in the diagram represents the relationship between the current that is actually measured and the time. The virtual line represents the simulation result using the simulation circuit according to the present invention. As shown in FIG. 8, it is obvious that the simulation result using the simulation circuit according to the present invention is in accord with the actual measurement. That is, the simulation circuit according to the present invention simulates the physical characteristics of the ferroelectric memory cell very precisely.

Figure 9:
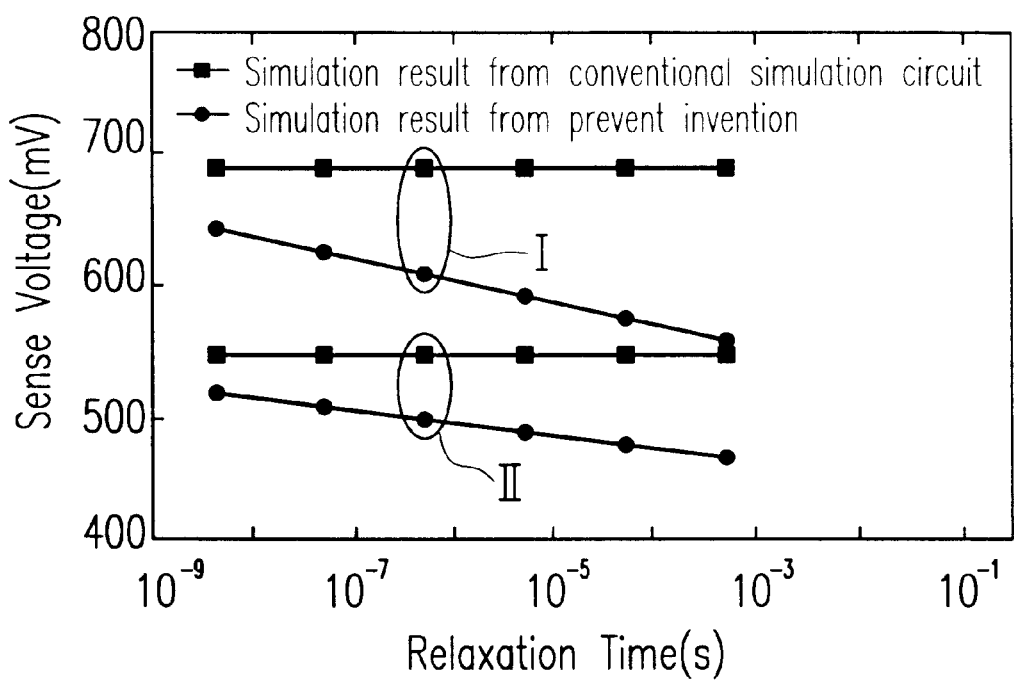
FIG. 9 is a relationship diagram of the relaxation time and the sense voltage; it shows both the simulation result of the conventional model and the simulation result according to the present invention.

FIG. 9 shows the relationship between the relaxation time and the sense voltage while using the conventional simulation circuit and the simulation circuit according to the present invention. FIG. 9 shows the impact of relaxation effect to the sense voltage on a 2T/2C (2 transistors/2 capacitors) memory cell. The lines marked as I represent the impact of the increase of the relaxation time to the sense voltage on the bit line during the period the voltage is applied to the plate line PL. The lines marked as II represent the impact of the increase of the relaxation time to the sense voltage on the bit line after the voltage is applied to the plate line PL. The square marks shown in the diagram represent the simulation results by using the conventional simulation circuit; the circle marks shown in the diagram represent the simulation result using the simulation circuit according to the present invention. As shown in the diagram, the sense voltage reduces significantly while using the simulation circuit according to the present invention. Contrariwise, the sense voltage is unchanged while using the conventional simulation circuit.

The distinguishing feature of the present invention is the joint coupling of a relaxation voltage source to the ferroelectric memory cell, where the output voltage of the relaxation voltage source is a logarithmic time dependence, to simulate the non-continuous characteristic of the hysteresis loop of the ferroelectric material precisely.

The other distinguishing feature of the present invention is the addition of the relaxation voltage source to simulate the physical characteristics of the ferroelectric memory, to make the control of the physical characteristics of the ferroelectric memory easier in conducting the predict and design of the ferroelectric memory.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims and not by the above detailed description.

What is claimed is:

1. A circuit to simulate a polarization relaxation phenomenon of a ferroelectric memory, comprising:
   a MOS transistor, wherein a gate of the MOS transistor is coupled to a word line and a source of the MOS transistor is coupled to a bit line;
   a ferroelectric capacitor, wherein a first electrode of the ferroelectric capacitor is coupled to a drain of the MOS transistor and a second electrode of the ferroelectric capacitor is coupled to a plate line;
   a capacitor, wherein a first electrode of the capacitor is coupled to the drain of the MOS transistor; and
   a relaxation voltage source, wherein a first terminal of the relaxation voltage source is coupled to the second electrode of the capacitor and a second terminal of the relaxation voltage source is coupled to ground.

2. The circuit of claim 1, wherein the capacitance of the capacitor is selectively far smaller than the capacitance of the bit line.

3. The circuit of claim 1, wherein the capacitor is a linear capacitor.

4. The circuit of claim 1, wherein an output voltage of the relaxation voltage source is a logarithmic time dependence.

5. The circuit of claim 1, wherein the relaxation voltage source further comprises:
   a first resistor having a first end and a second end, wherein the first end of the first resistor is coupled to an input voltage;
   a first amplifier having an input and an output, wherein the input is coupled to the second end of the resistor;
   a capacitor coupled between the input of the first amplifier and the output of the first amplifier;
   a second amplifier having an input and an output;
   a second resistor coupled between the output of the first amplifier and the input of the second amplifier; and
   a diode coupled between the input of the second amplifier and the output of the second amplifier.

6. A circuit to simulate a polarization relaxation phenomenon of a ferroelectric memory, comprising:
   a MOS transistor, wherein a gate of the MOS transistor is coupled to a word line and the source of the MOS transistor is coupled to a bit line;
   a ferroelectric capacitor, wherein a first electrode of the ferroelectric capacitor is coupled to a drain of the MOS transistor and the second electrode of the ferroelectric capacitor is coupled to a plate line; and
   a relaxation voltage source, wherein a first terminal of the relaxation voltage source is coupled to the drain of the MOS transistor and the second terminal of the relaxation voltage source is coupled to a ground.

7. The circuit of claim 6, wherein the output voltage of the relaxation voltage source is a logarithmic time dependence.

8. The circuit of claim 6, wherein the relaxation voltage source further comprises:
   a first resistor having a first end and a second end, wherein the first end of the first resistor is coupled to an input voltage;
   a first amplifier having an input and an output, wherein the input is coupled to the second end of the resistor;
   a capacitor coupled between the input of the first amplifier and the output of the first amplifier;
   a second amplifier having an input and an output;
   a second resistor coupled between the output of the first amplifier and the input of the second amplifier; and
   a diode coupled between the input of the second amplifier and the output of the second amplifier.

9. A circuit to simulate a polarization relaxation phenomenon of a ferroelectric memory, comprising:
   a MOS transistor; a ferroelectric capacitor, wherein a first electrode of the ferroelectric capacitor is coupled to a drain of the MOS transistor and a second electrode of the ferroelectric capacitor receives a control voltage for operating the ferroelectric capacitor;
   a capacitor, wherein a first electrode of the capacitor is coupled to the drain of the MOS transistor; and
   a relaxation voltage source coupled to the capacitor.

10. The circuit of claim 9, wherein the capacitor is a linear capacitor.

11. The circuit of claim 9, wherein an output voltage of the relaxation voltage source is a logarithmic time dependence.

12. The circuit of claim 9, wherein the relaxation voltage source further comprises:
   a first resistor having a first end and a second end, wherein the first end of the first resistor is coupled to an input voltage;
   a first amplifier having an input and an output, wherein the input is coupled to the second end of the resistor;
   a capacitor coupled between the input of the first amplifier and the output of the first amplifier;
   a second amplifier having an input and an output;
   a second resistor coupled between the output of the first amplifier and the input of the second mplifier; and
   a diode coupled between the input of the second amplifier and the output of the second amplifier.

* * * * *